(12) United States Patent
Chen et al.

(10) Patent No.: US 7,277,329 B2
(45) Date of Patent: Oct. 2, 2007

(54) ERASE METHOD TO REDUCE ERASE TIME AND TO PREVENT OVER-ERASE

(75) Inventors: Chung-Zen Chen, Hsinchu (TW); Chung-Shan Kuo, Shulin (TW)

(73) Assignee: Elite Semiconductor Memory Technology, Inc., Hsinchu (TW)

( * ) Notice: Subject to any disclaimer, the term of this patent is extended or adjusted under 35 U.S.C. 154(b) by 53 days.

(21) Appl. No.: 11/297,085

(22) Filed: Dec. 8, 2005

(65) Prior Publication Data
US 2007/0076465 A1 Apr. 5, 2007

(30) Foreign Application Priority Data
Oct. 4, 2005 (TW) .................................. 94134629

(51) Int. Cl.
*G11C 11/34* (2006.01)
(52) U.S. Cl. ............................... 365/185.3; 365/185.22
(58) Field of Classification Search ............ 365/185.3, 365/185.22, 185.19
See application file for complete search history.

(56) References Cited

U.S. PATENT DOCUMENTS 5,414,664 A * 5/1995 Lin et al. ............... 365/185.22
6,529,413 B2 * 3/2003 Lee et al. ............... 365/185.22
6,639,844 B1 * 10/2003 Liu et al. .................. 365/185.3
6,903,980 B2 * 6/2005 Miki et al. ................ 365/185.3

* cited by examiner

*Primary Examiner*—Anh Phung
(74) *Attorney, Agent, or Firm*—Hogan & Hartson LLP

(57) ABSTRACT

An erase method used in an array of flash memory cells arranged in a plurality of sectors provides each sector with an erase flag. The erase flag of sectors to be erased are set to a first value. The memory cells are sequentially verified from a first sector to a last sector whose flag is set to the first value and for each sector from a first address to a last address. When verification fails and the number of the same-cell-verifications is less than a predetermined number, the method applies an erase pulse and verifies the memory call at the same memory address again. When verification fails and the number of same-cell-verifications reaches the predetermined number, the remaining sectors whose flag is set to the first value are verified. When each memory cell of a sector to be erased passes verification, the erase flag of the sector is set to a second value. When the flag of each sector to be erased is set to the second value, the erase operation is terminated.

10 Claims, 7 Drawing Sheets

ERASE METHOD TO REDUCE ERASE TIME AND TO PREVENT OVER-ERASE

FIELD OF THE INVENTION

The present invention relates to a nonvolatile memory and a device having a nonvolatile memory. More specifically, the present invention relates to an erase method used in flash memory.

BACKGROUND

It is often desirable to use memory devices that will retain information even when power is temporarily interrupted, or when the device is left without applied power for indefinite periods of time. Semiconductor memories with this characteristic are known as nonvolatile memories. One variety of nonvolatile memory with broad application is the electrically erasable and programmable read only memory ("EEPROM"). Information can be electronically stored and erased in memory cells of EEPROM.

A conventional EEPROM device has an array of memory cells arranged in an N×M matrix on a single chip where N is the number of rows and M is the number of columns. The array is divided into a number of sectors, each of which can be separately selected for erasure. Each sector is formed of a predetermined number of rows which are grouped together. The 16 Mb (megabit) flash memory shown in FIG. 1 is divided into 32 sectors. Each sector has a size of 64 k bytes and may include 256 rows and 256 columns.

Each cell has an N-type source region and an N-type drain region integrally formed within a P-type substrate. A floating gate is separated from the substrate by a thin dielectric layer. A second dielectric layer separates a control gate from the floating gate. A P-type channel region in the substrate separates the source and drain regions. The control gates of the cell transistors are coupled to word lines, and the drains thereof are coupled to bit lines. In the illustrated EEPROM where memory cells are divided into a plurality of sectors, the source region of each cell transistor is connected to a common node within each sector. This node is called Vsc. Thus, all of the memory cells within the sector are erased simultaneously and erasure is performed only on a sector-by-sector basis.

EEPROMs typically are programmed by injecting hot-electrons to the floating gate when a high voltage is applied to the control gate and the drain region while low voltage is applied to the source region. For example, the drain voltage may be set to approximately +4.5 volts and the control gate voltage may be set to approximately +9 volts while the source region is held at a ground potential. In an erasing operation, flash memory cells in a sector may be simultaneously erased by means of the so-called Fowler-Nordheim (F-N) tunneling mechanism. A positive voltage (e.g., +6 volts) is applied to the source region, a negative voltage (e.g., −9 volts) is applied to the control gate, and the drain region is allowed to float. A strong electric field between 12 to 9 MV/cm is generated between the control gate and the substrate under this bias condition, so that negative charges accumulated in the floating gate are discharged into the source region through the thin insulator. In a read operation, the source region typically is held at a ground potential (0 volts) and the control gate has a voltage at about +5 volts. The drain region is connected to a voltage between +1 to +2 volts. The above examples are given for explanation only and other voltage values may be used so as to provide similar programming, erasing, and reading operations.

A conventional erase method sequentially erases every memory cell in sectors to be erased. If a cell fails verification, an erase pulse is applied to all sectors to be erased and the cell is verified again. This process repeats until the cell passes the verification and then the next cell is verified. If a cell is very hard to be erased, applying erase pulses repeatedly may over erase normal memory cells.

To avoid over-erase, an improved erase method as shown in FIG. 2 uses sector erase flags for each sectors. Once all memory cells in a sector are successfully erased and verified, the erase flag of that sector is set and that sector is not erased again. Accordingly, normal sectors are not over erased due to the presence of a hard-to-erase memory cell in another sector. However, because of the repeated erasure attempts, a hard-to-erase memory cell still consumes excessive time for verification. Over-erase is still possible under the improved technique. For example, if a cell takes 100 erase pulses to pass verification, it requires about 21 seconds, assuming each verification time period is about 200 ns and each erase pulse time period is about 10 ms.

To reduce the total erase time, another improved method as shown in FIG. 3 has an address register for each sector to record an address of a cell that fails verification in the sector. For each sector, memory cells are sequentially verified. If a cell fails verification, the address is stored in the sector address register. Thus, after applying an erase pulse, there is no need to begin verification from the first memory cell in the sector. Instead, verification continues on the memory cell that previously failed the verification. However, sector address registers takes chip space from memory cells. For example, in a 16M flash memory with 35 sectors, the area occupied by the sector address registers is about 0.89 mm$^2$ out of the 14 mm$^2$, the 16M chip size.

SUMMARY OF THE PREFERRED EMBODIMENTS

An erase method used in an array of flash memory cells arranged in a plurality of sectors provides each sector with an erase flag. The erase flag of sectors to be erased are set to a first value. The memory cells are sequentially verified from a first sector to a last sector whose flag is set to the first value and for each sector from a first address to a last address. When verification fails and the number of same-cell-verifications is less than a predetermined number, the sector is supplied with an erase pulse and a memory cell at the same memory address is verified again. When verification fails and the number of same-cell-verifications reaches the predetermined number, the remaining sectors whose flag is set to the first value are verified. When each memory cell of a sector to be erased passes verification, the erase flag of the sector is set to a second value. When the flag of each sector to be erased is set to the second value, the erase operation is terminated.

BRIEF DESCRIPTION OF THE DRAWINGS

A more complete understanding of the present invention can be obtained by reference to the detailed description in conjunction with the accompanying drawings, which form part of the disclosure. These drawings depict only a typical embodiment of the invention and are not intended to limit its scope.

DETAILED DESCRIPTION OF THE PREFERRED EMBODIMENTS

To reduce the total erase time and to avoid over erase of a nonvolatile memory, a preferred embodiment can skip a hard-to-erase memory address and continue to verify the remaining sectors and later return to tackle with that specific memory address. The nonvolatile memory has an array of memory cells arranged in a plurality of sectors. Within each sector, the source region of each cell transistor is connected to a common node. Thus, all of the cells within the sector are erased simultaneously and the erasure is performed on a sector-by-sector basis. When the verification of a memory address in a sector fails, an erase pulse is applied to the sector or to all sectors to be erased. After several erasure cycles, even if a hard-to-erase memory address has not passed verification, memory cells in other sectors to be erased may readily pass the verification. In this situation, the preferred embodiment can skip the hard-to-erase memory address and continue to verify memory addresses in other sectors. Therefore, other sectors can be verified earlier to reduce the total erase time and over erase can be avoided.

Each sector has an erase flag to indicate the erasure status of that sector. The erase flag is set to a first value to indicate that the sector needs to be erased. The erase flag is set to a second value to indicate that the sector is successfully erased and verified. A current address register is used to indicate the address of a cell to be currently verified. An erase time counter is used to indicate the number of times of applying an erase pulse to and verifying the cell at the same address. When the same address is continuously erased and verified a certain number of times and still fails, that hard-to-erase address is skipped and the current address register is set to a first address of the next sector to be erased. In one embodiment, the number of erasure pulses prior to skipping to a next sector is set to be between about 10-50.

Figure 1:
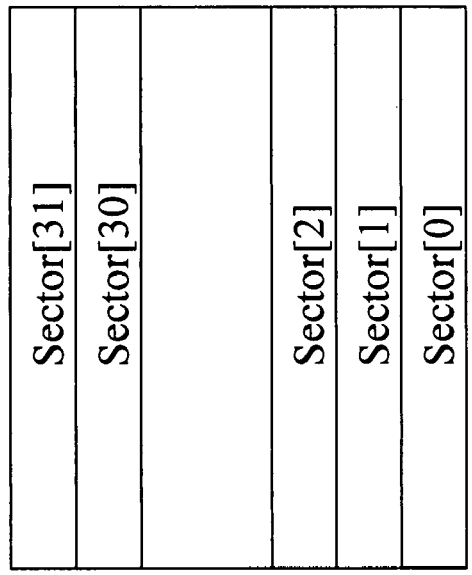
FIG. 1 is a schematic diagram of the structure of a nonvolatile memory.
Figure 1:
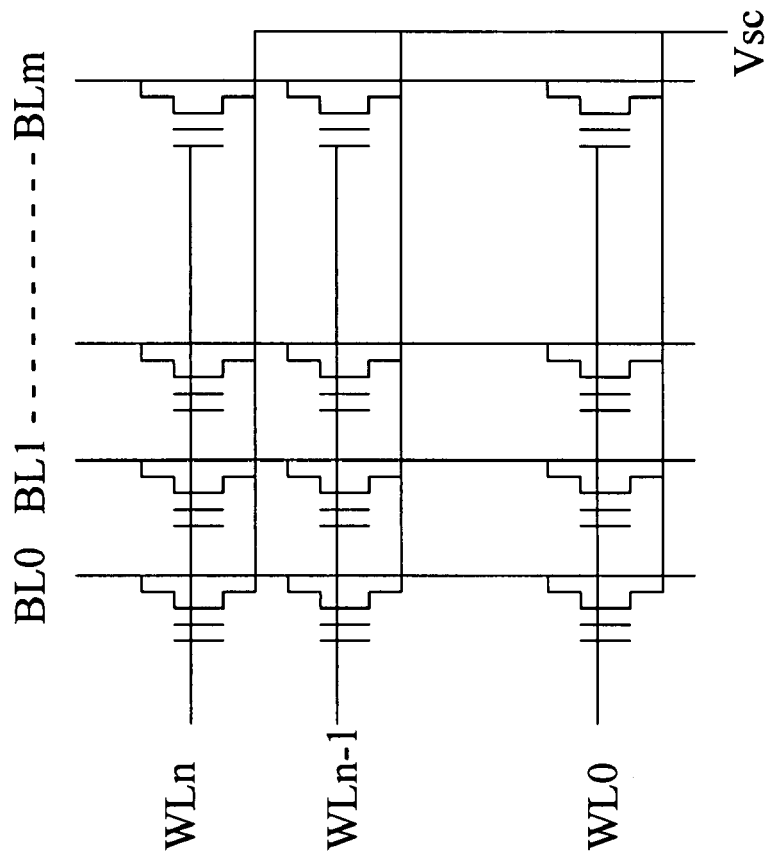
Figure 2:
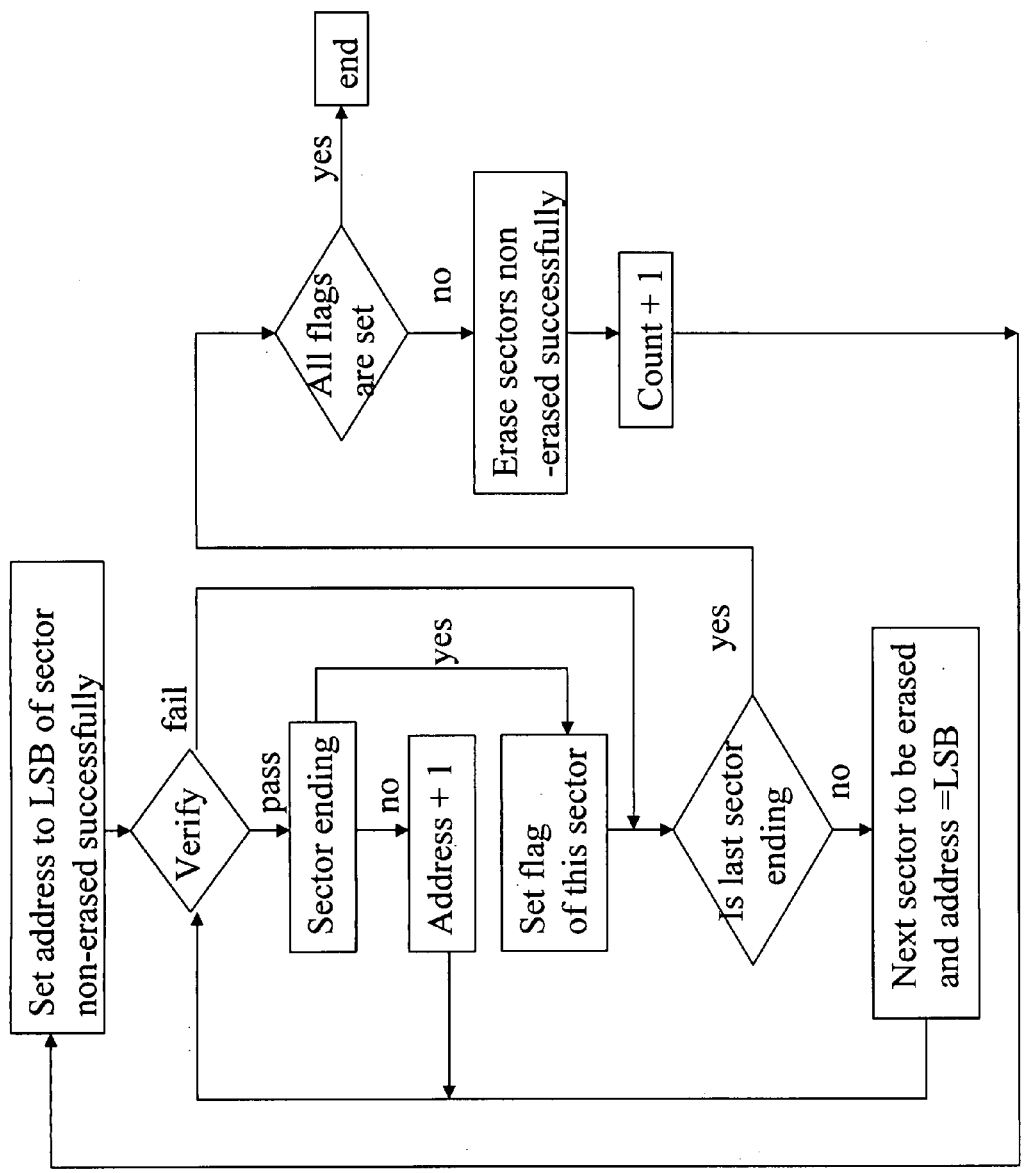
FIG. 2 is a flow chart diagram of a conventional erase method using erase flags.
Figure 3:
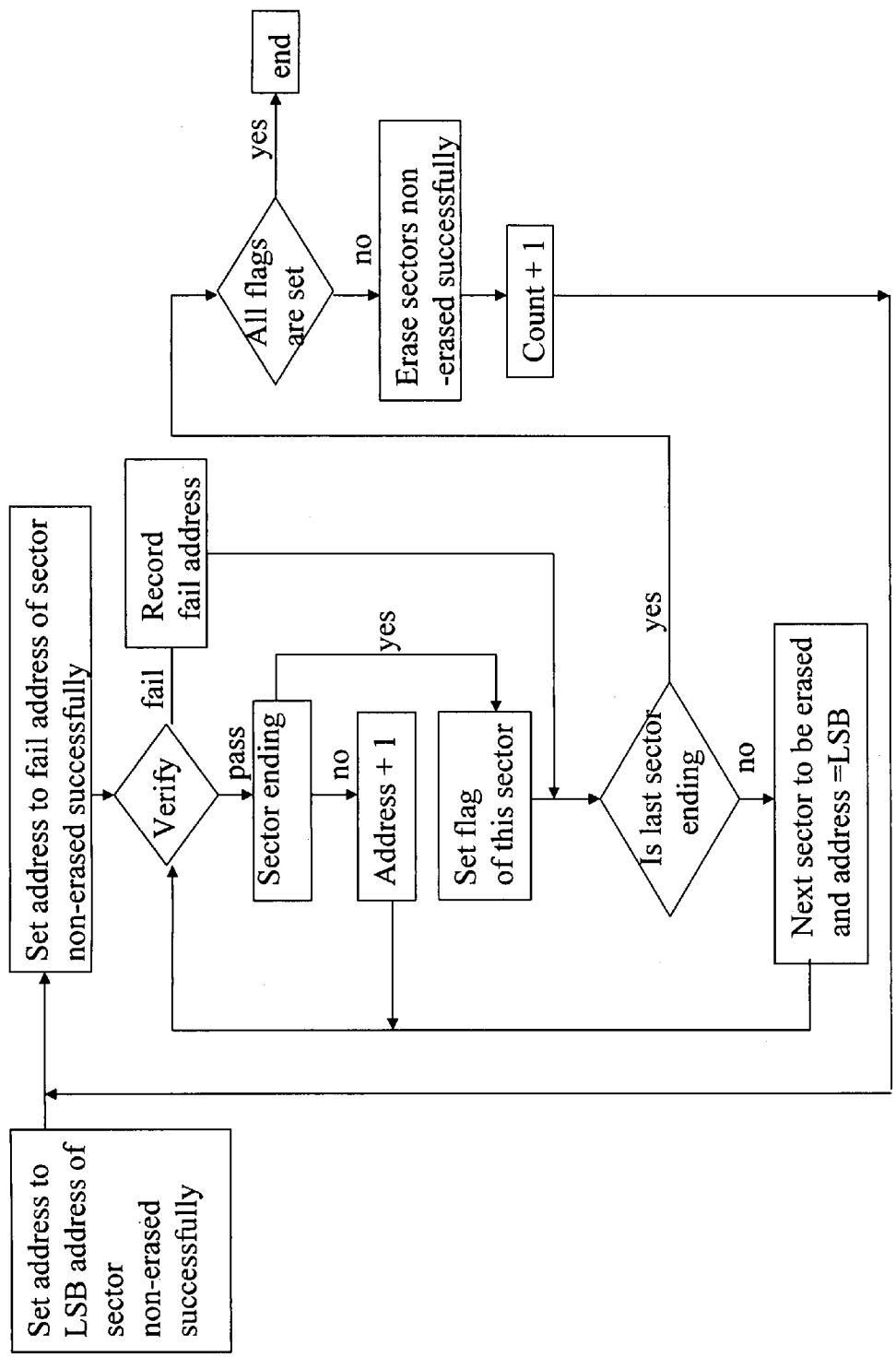
FIG. 3 is a flow chart diagram of another conventional erase method using sector address registers.
Figure 4A:
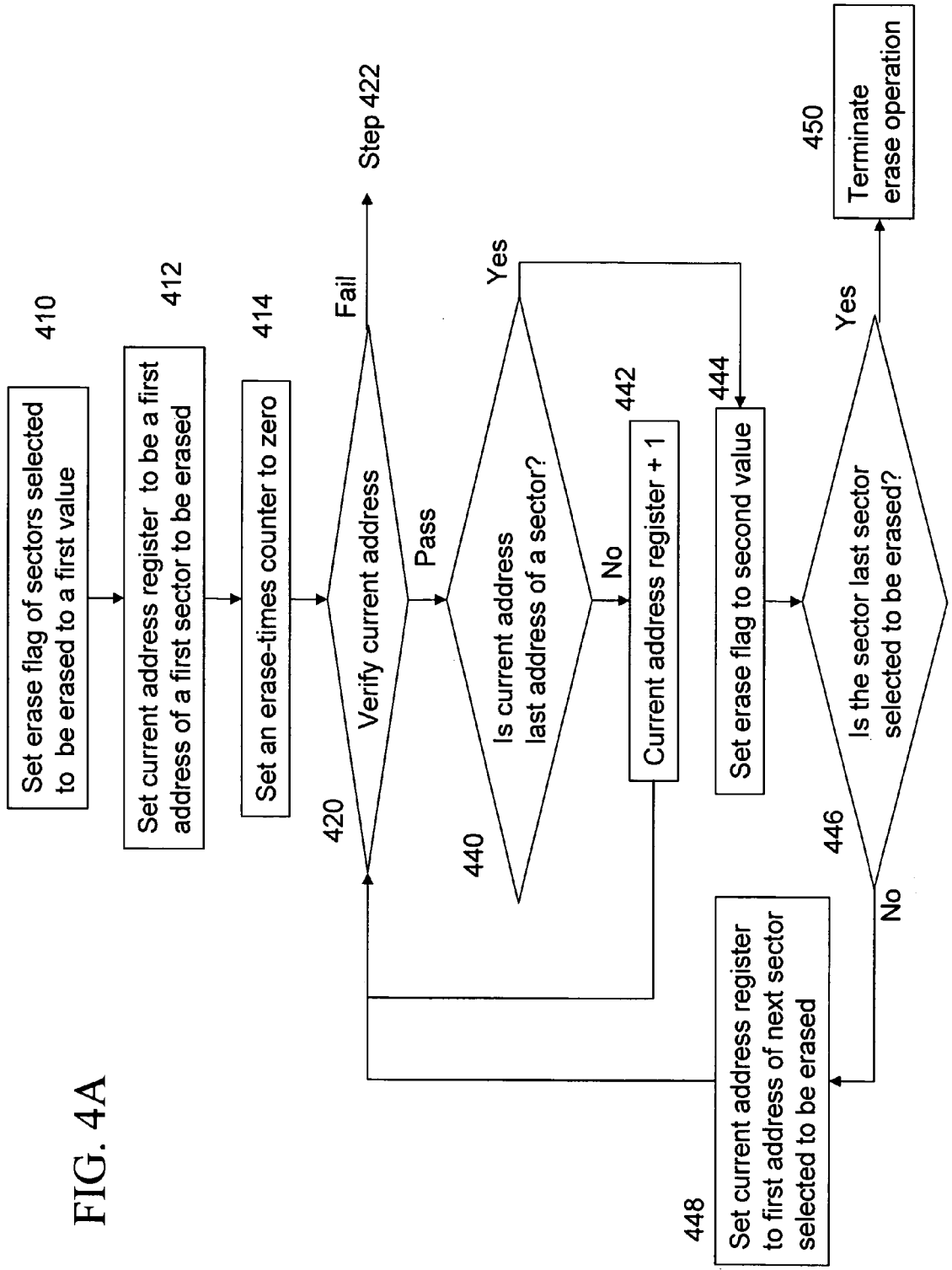
FIGS. 4A, 4B, and 4C is a flow chart diagram of an exemplary erase method.
Figure 4B:
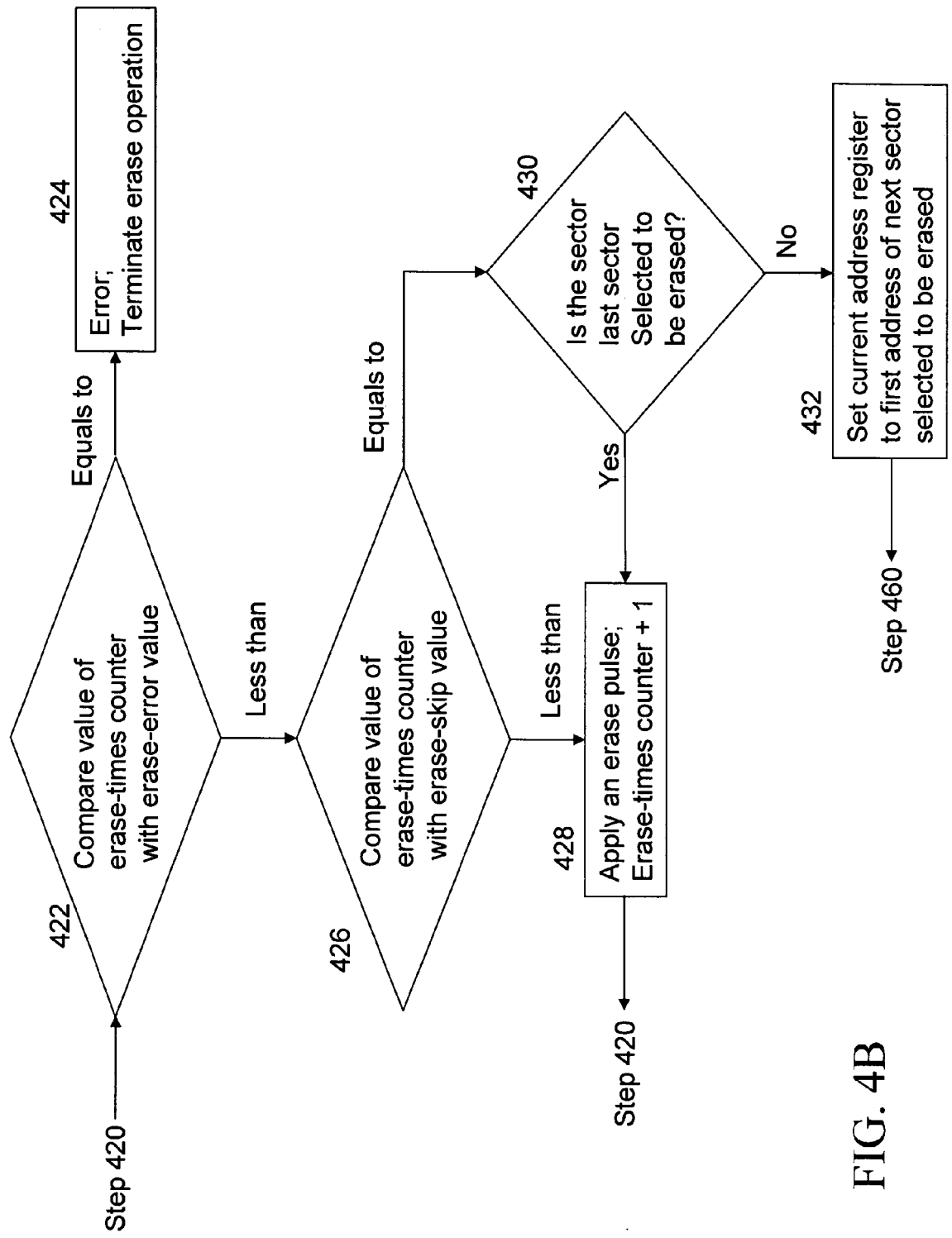
Figure 4C:
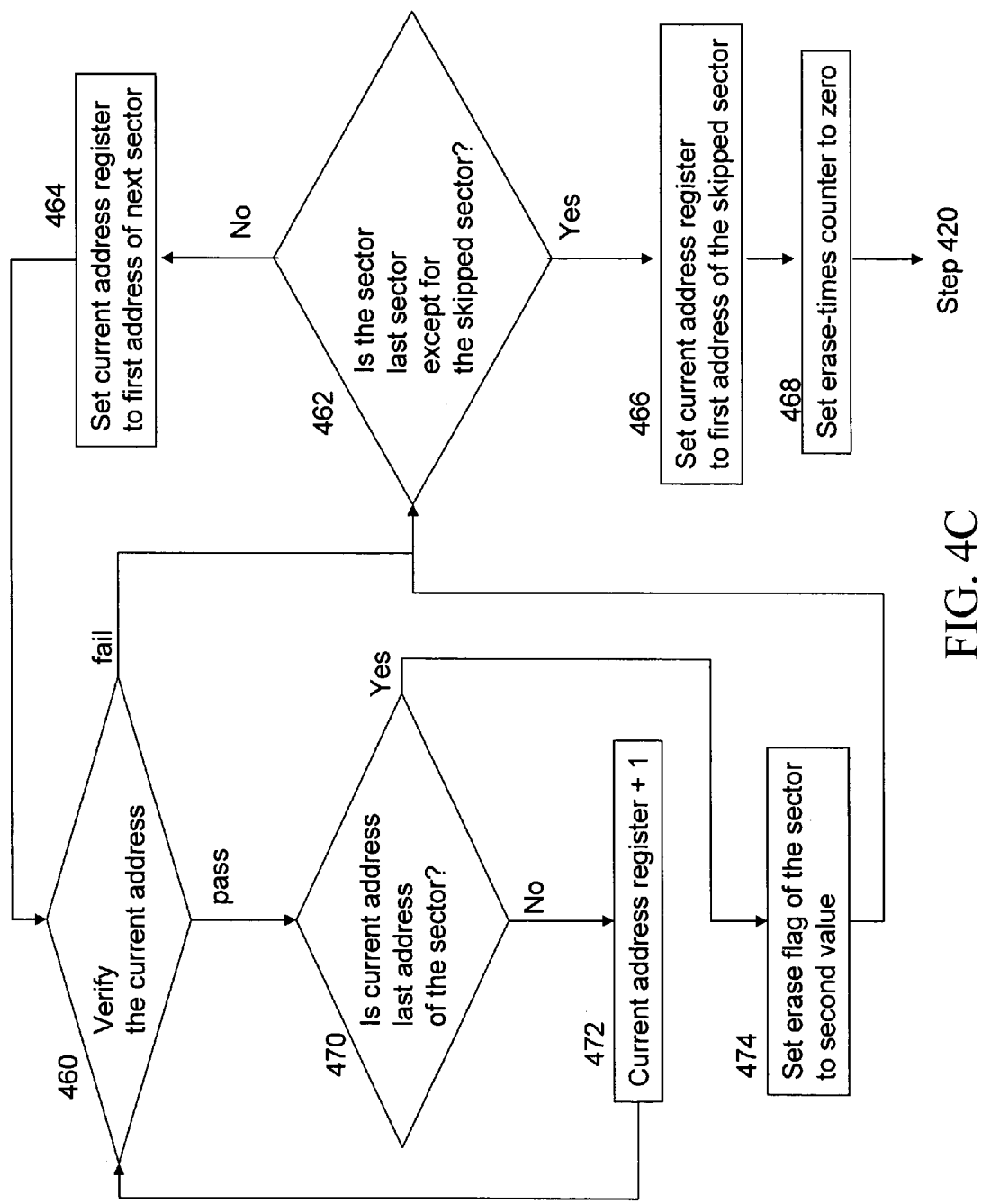

FIGS. 4A, 4B, and 4C show the process flow of a preferred embodiment. As shown in FIG. 4A, at step 410, the erase flag of sectors to be erased is set to a first value. At step 412, the current address register is set to the first address of the first sector to be erased. At step 414, the erase time counter is set to zero. At step 420, the address stored in the current address register is verified. Initially, the first address of the first sector to be erased is verified.

As shown in FIG. 4B, at step 422, if the verification fails, the value of the erase-times counter is compared with an erase-error value. At step 424, if the value of the erase-times counter reaches the erase error value, the erasure process is terminated and a signal of failure is sent. At step 426, if the value of the erase-times counter is less than the erase-error value, the value of the erase-times counter is compared again with an erase-skip value, for example ranging from about 10 to about 50. If the value of the erase-times counter is less than the erase-skip value, at step 428, an erase pulse is applied to all sectors whose erase flags have the first value and the value of the erase-times counter is increased by one. Then the method goes to step 420 for verification again. At step 430, if the value of the erase-times counter reaches the erase-skip value, the method determines whether the sector is the last sector whose erase flag still has a first value. If the sector is the last sector, go to step 428. If the sector is not the last sector whose erase flag has a first value, at step 432, the sector having the hard-to-erase cell is skipped and the current address register is set to the first address of the next sector whose erase flag has the first value and then the method proceeds to step 460 for rapid verification.

Returning to FIG. 4A, at step 440, if verification succeeds, the method compares the value of the current address register to decide whether the current address is the last address in the sector. At step 442, if the current address is not the last address in the sector, the value of the current address register is increased by one and the method goes to step 420 for verification. At step 444, if the current address is the last address in the sector, the sector's erase flag is set to the second value to indicate that the sector is successfully erased and verified. At step 446, the method determines whether the sector is the last sector whose erase flag has the first value. At step 448, if the sector is not the last sector to be erased, the current address register is set to the first address of the next sector to be erased and the method goes to step 420 for verification. At step 450, if the sector is the last sector to be erased which means all erase flags of sectors to be erased are set to the second value, the erasure process is complete.

During the rapid verification loop, if an address in a sector is not successfully verified at the first attempt, the sector is skipped. As shown in FIG. 4C, at step 460, the method verifies the cell at the address stored in the current address register. At step 462, if the verification fails, the method decides whether the sector is the last sector to be erased other than the skipped sector or sectors. At step 464, if the sector is not the last sector except the skipped sector, the current address register is set to the first address of the next sector to be erased. The method then goes to step 460 for verification. At step 466, if the sector is the last sector to be erased except for the skipped sector, the current address register is set to the first address of the skipped register. At step 468, the erase-times counter is set to zero. The method then goes back to step 420 for verification.

At step 470, if the verification succeeds during the rapid verification loop, the method decides whether the address is the last address of the sector. At step 472, if the address is not the last address of the sector, the value of the current address register is increased by one. The method then goes to step 460 for verification. At step 474, if the address is the last address of the sector, the sector's erase flag is set to the second value to indicate that the whole sector is successfully erased and verified. The method then goes to step 462 to decide whether the sector is the last sector to be erased except for the skipped sector.

To avoid over erase, another embodiment of the erase method can apply an erase pulse to the sector that fails verification and periodically to all sectors whose erase flags have the first value. One possible arrangement is to apply the periodic, all sector erase pulse once every several times to all sectors whose erase flags have the first value rather than only to the sector that fails the verification. As another example, the method may apply the periodic, all sector erase pulse every other time for the sectors whose erase flags have the first value rather than only to the sector that fails verification.

Figure 5:
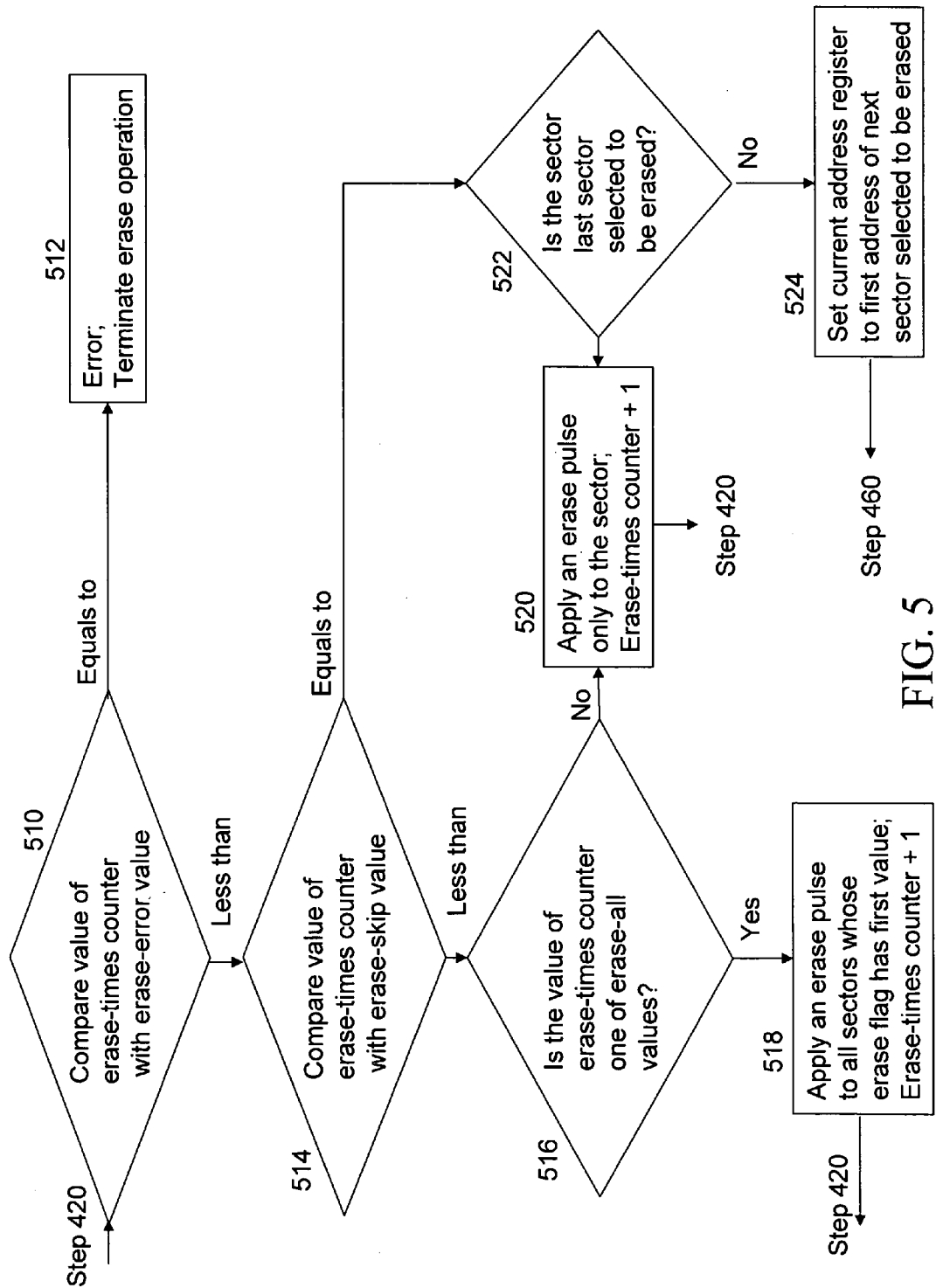
FIG. 5 is a flow chart diagram of another exemplary erase method.

FIG. 5 shows an alternative process flow after a cell at an address fails verification. At step 510, if the verification fails, the method compares the value of the erase-times counter with an erase-error value. At step 512, if the value of the erase-times counter reaches the erase error value, the erasure process is terminated and a signal of failure is sent. At step 514, if the value of the erase-times counter is less than the erase-error value, the method compares the value of the erase-times counter again with an erase-skip value, for example 50. If the value of the erase-times counter is less than the erase-skip value, at step 516, the method then compares the value of the erase-times counter to decide whether it corresponds to one of the erase-all cycles. At step 518, if the value of the erase-times counter corresponds to one of the erase-all cycles, the erase pulse is applied to all sectors whose erase flags have the first value. For example, if the value of the erase-times counter is an even number, the erase pulse is applied to all sectors whose erase flags have the first value. The value of the erase-times counter is increased by one. Then the method goes to step 420 for verification again. At step 520, if the value of the erase-times counter is not one of the erase-all numbers, the erase pulse is applied only to the sector that failed the verification. For example, if the value of the erase-times counter is an odd number, the erase pulse is applied only to the sector that failed verification. The value of the erase-times counter is increased by one. Then the method goes to step 420 for verification again.

If the value of the erase-times counter reaches the erase-skip value, at step 522, the method decides whether the sector most recently verified is the last sector whose erase flag has a first value. If the sector is the last sector, the method goes to step 520. If the sector is not the last sector whose erase flag has a first value, at step 524, the sector having that hard-to-erase cell is skipped and the current address register is set to the first address of the next sector whose erase flag has the first value and then the method goes to step 460 for rapid verification.

Although the invention has been described in terms of exemplary embodiments, it is not limited thereto. The described embodiment is to be considered in all respects only as illustrative and not as restrictive. The present invention may be embodied in other specific forms without departing from its essential characteristics. The scope of the invention, therefore, is indicated by the appended claims rather than by the foregoing description. All changes, which come within the meaning and range of the equivalents of the claims, are to be embraced within their scope.

What is claimed is:

1. An erase method used in an array of non-volatile memory cells arranged in a plurality of sectors, each sector having an erase flag, the method comprising:
   setting the erase flag of sectors selected to be erased to a first value;
   sequentially verifying memory cells in sectors beginning from a first sector to a last sector whose erase flag is set to the first value and for each sector beginning from a first address to a last address;
   when verification fails, applying an erase pulse to the sector and verifying a memory cell at the same memory address again if a value of a erase-times counter is less than an erase-skip value, verifying the remaining sectors whose erase flag has the first value if the value of the erase-times counter reaches the erase-skip value;
   when each memory cell of a sector to be erased passes verification, setting the erase flag of the sector to a second value;
   when the erase flag of each sector selected to be erased is set to the second value, terminating the erase operation.

2. The erase method of claim 1, further comprising:
   pre-programming memory cells in all sectors selected to be erased to a logic level of zero.

3. The erase method of claim 1, wherein the erase-skip value ranges from approximately 10 to approximately 50.

4. The erase method of claim 1, further comprising, when the value of the erase-times counter reaches an erase-fail value, terminating the erase operation.

5. The erase method claim 4, wherein the erase-fail value is approximately 1000.

6. The erase method of claim 1, further comprising, when verification fails, applying an erase pulse to the sector and periodically to all sectors whose flag is set to a first value and verifying a same memory cell again if the value of the erase-times counter is less than the erase-skip value, verifying the remaining sectors whose erase flag has the first value if the value of the erase-times counter reaches the erase-skip value.

7. The erase method of claim 1, further comprising, when verification fails, applying an erase pulse to the sector and every other time to all sectors whose erase flag is set to a first value and verifying a same memory cell again if the value of the erase-times counter is less than the erase-skip value, verifying the remaining sectors whose erase flag has the first value if the value of the erase-times counter reaches the erase-skip value.

8. The erase method of claim 1, further comprising, when verification fails, applying an erase pulse only to the sector that fails the verification if the value of the erase-times counter is not one of erase-all values, applying an erase pulse to the remaining sectors whose erase flag has the first value if the value of the erase-times counter is one of erase-all values.

9. The erase method of claim 8, wherein the erase-all values can be all odd numbers or all even numbers.

10. An erase method used in an array of non-volatile memory cells arranged in a plurality of sectors, each sector having an erase flag, the method comprising:
    (a) setting the erase flag of sectors selected to be erased to a first value;
    (b) setting a current address register to be a first address of a first sector selected to be erased;
    (c) setting an erase-times counter to a beginning value;
    (d) sequentially verifying memory cells in sectors beginning from a first sector selected to be erased to a last sector selected to be erased and for each sector beginning from a first address to a last address;
    (e) when verification fails and the erase-times counter has a value less than an erase-skip value, applying an erase pulse to the sector and periodically to all sectors which have not passed verification, increasing the value of the erase-times counter by one and verifying the current address again;
    (f) when verification fails, the erase-times counter has a value that equals to the erase-skip value and the sector is not the last sector whose erase flag has the first value, verifying the remaining sectors which have not passed verification, setting the current address to be a first address of the next sector to be erased and setting the erase-times counter to zero;
    (g) when verification is passed and the current address is not the last address of the sector, increasing the current address by one;
    (h) when verification is passed and the current address is the last address of the sector, setting the erase flag of the sector to a second value and setting the current address to a first address of the next sector selected to be erased; and
    (i) terminating the erase operation when the erase flag of all sectors selected to be erased is set to the second value.

* * * * *